(12) United States Patent
Lee et al.

(10) Patent No.: US 8,877,567 B2
(45) Date of Patent: Nov. 4, 2014

(54) SEMICONDUCTOR DEVICE AND METHOD OF FORMING UNIFORM HEIGHT INSULATING LAYER OVER INTERPOSER FRAME AS STANDOFF FOR SEMICONDUCTOR DIE

(75) Inventors: KyungHoon Lee, Kyunggi-Do (KR); Soo Moon Park, Kyunggi-Do (KR); SeungWon Kim, Kyunggi-Do (KR)

(73) Assignee: STATS ChipPAC, Ltd., Singapore (SG)

( * ) Notice: Subject to any disclaimer, the term of this patent is extended or adjusted under 35 U.S.C. 154(b) by 266 days.

(21) Appl. No.: 12/949,396

(22) Filed: Nov. 18, 2010

(65) Prior Publication Data
US 2012/0126395 A1 May 24, 2012

(51) Int. Cl.
*H01L 23/498* (2006.01)
*H01L 21/56* (2006.01)
*H01L 23/31* (2006.01)
*H01L 23/00* (2006.01)

(52) U.S. Cl.
CPC ......... *H01L 23/3121* (2013.01); *H01L 2224/97* (2013.01); *H01L 24/16* (2013.01); *H01L 21/563* (2013.01); *H01L 2224/8114* (2013.01); *H01L 23/49816* (2013.01); *H01L 2924/13091* (2013.01); *H01L 24/97* (2013.01); *H01L 21/561* (2013.01); *H01L 21/565* (2013.01); *H01L 2224/10165* (2013.01); *H01L 23/49827* (2013.01); *H01L 2224/16225* (2013.01); *H01L 2924/01322* (2013.01); *H01L 21/568* (2013.01); *H01L 24/81* (2013.01); *H01L 23/3128* (2013.01); *H01L 24/13* (2013.01)
USPC ............ 438/127; 257/E21.499; 257/E21.502; 257/E21.503; 438/106; 438/108; 438/110; 438/112

(58) Field of Classification Search
USPC ................... 257/E21.499, E21.502, E21.503; 438/106, 108, 110, 112, 127
See application file for complete search history.

(56) References Cited

U.S. PATENT DOCUMENTS

| | | | |
|---|---|---|---|
| 5,341,564 A * | 8/1994 | Akhavain et al. | 29/832 |
| 5,633,535 A * | 5/1997 | Chao et al. | 257/778 |
| 5,657,207 A * | 8/1997 | Schreiber et al. | 361/774 |
| 5,659,952 A * | 8/1997 | Kovac et al. | 29/840 |
| 5,776,796 A * | 7/1998 | Distefano et al. | 438/106 |
| 6,048,656 A * | 4/2000 | Akram et al. | 438/118 |
| 6,080,605 A * | 6/2000 | Distefano et al. | 438/126 |
| 6,255,142 B1 * | 7/2001 | Babiarz et al. | 438/126 |
| 6,933,173 B2 | 8/2005 | Yunus | |
| 7,052,935 B2 | 5/2006 | Pai et al. | |
| 7,148,560 B2 * | 12/2006 | Lee et al. | 257/667 |
| 7,372,134 B2 | 5/2008 | Khaw et al. | |

(Continued)

*Primary Examiner* — Peniel M Gumedzoe
(74) *Attorney, Agent, or Firm* — Robert D. Atkins; Patent Law Group: Atkins and Associates, P.C.

(57) ABSTRACT

A semiconductor device has an interposer frame having a die attach area. A uniform height insulating layer is formed over the interposer frame at corners of the die attach area. The insulating layer can be formed as rectangular or circular pillars at the corners of the die attach area. The insulating layer can also be formed in a central region of the die attach area. A semiconductor die has a plurality of bumps formed over an active surface of the semiconductor die. The bumps can have a non-fusible portion and fusible portion. The semiconductor die is mounted over the insulating layer which provides a uniform standoff distance between the semiconductor die and interposer frame. The bumps of the semiconductor die are bonded to the interposer frame. An encapsulant is deposited over the semiconductor die and interposer frame and between the semiconductor die and interposer frame.

17 Claims, 14 Drawing Sheets

(56) References Cited

U.S. PATENT DOCUMENTS

| | | |
|---|---|---|
| 7,615,865 B2 | 11/2009 | Kang et al. |
| 2004/0232561 A1* | 11/2004 | Odegard .................. 257/778 |
| 2005/0104222 A1 | 5/2005 | Jeong et al. |
| 2005/0167830 A1* | 8/2005 | Chang et al. .................. 257/737 |
| 2006/0223239 A1* | 10/2006 | Khaw et al. .................. 438/127 |
| 2006/0281203 A1* | 12/2006 | Epler et al. .................. 438/22 |
| 2007/0184688 A1* | 8/2007 | Avitia et al. .................. 439/82 |
| 2008/0017983 A1 | 1/2008 | Tzeng et al. |
| 2008/0179739 A1 | 7/2008 | Liu et al. |

* cited by examiner

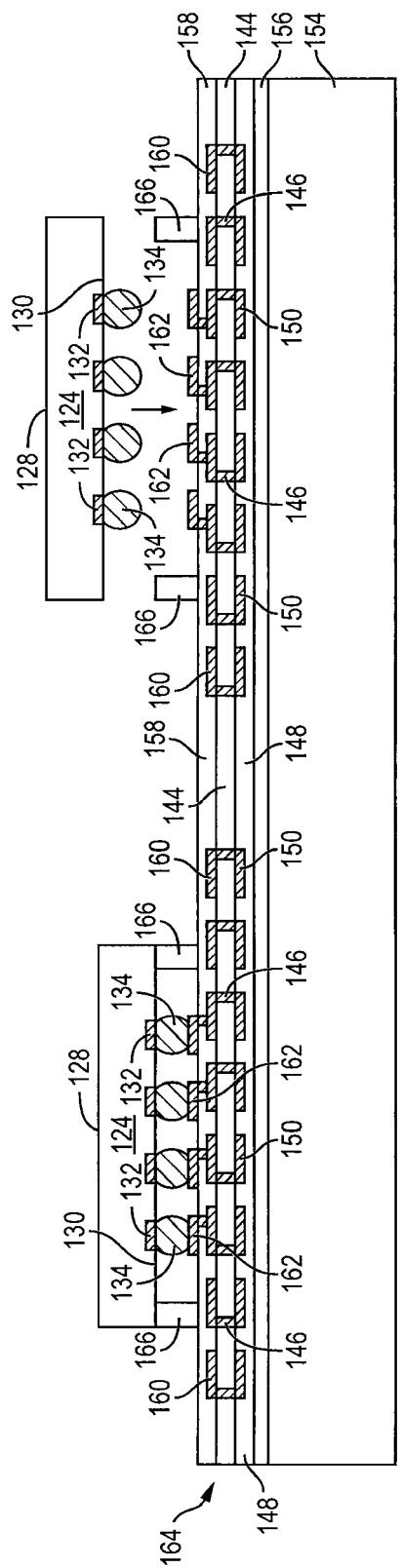
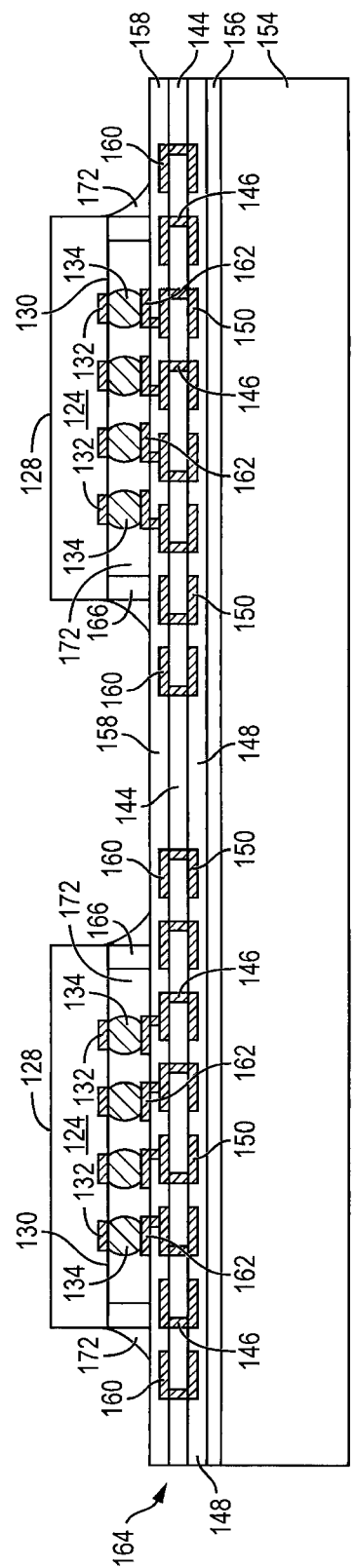
FIG. 4h
FIG. 4i

SEMICONDUCTOR DEVICE AND METHOD OF FORMING UNIFORM HEIGHT INSULATING LAYER OVER INTERPOSER FRAME AS STANDOFF FOR SEMICONDUCTOR DIE

FIELD OF THE INVENTION

The present invention relates in general to semiconductor devices and, more particularly, to a semiconductor device and method of forming a uniform height insulating layer over an interposer frame as a standoff for a semiconductor die.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

In a fan out wafer level chip scale package (Fo-WLCSP), a semiconductor die is mounted to a substrate by metallurgically and electrically connecting bumps formed on the semiconductor die to a conductive layer on the substrate using a reflow process. During reflow, the bump material can spread to adjacent conductive layers, known as bump bridging, and cause electrical shorting and device failure. In other cases, due to bump collapse during reflow, some of the bumps may fail to make contact with the intended conductive layer, which also causes device defects.

A principal cause of the bump failures is an uneven or non-uniform standoff distance between the semiconductor die and substrate. Any warpage of the semiconductor die or unevenness in placement of the semiconductor die over the substrate can result in the non-uniform standoff across the mating surfaces of the semiconductor die and substrate. In addition, encapsulant or underfill voids can form particularly in areas where the standoff distance is low.

SUMMARY OF THE INVENTION

A need exists to provide uniform standoff between a semiconductor die and substrate. Accordingly, in one embodiment, the present invention is a method of making a semiconductor device comprising the steps of providing an interposer frame having a die attach area, forming a uniform height insulating layer over the interposer frame at corners of the die attach area, providing a semiconductor die having a plurality of bumps formed over an active surface of the semiconductor die, mounting the semiconductor die over the uniform height insulating layer which provides a uniform standoff distance between the semiconductor die and interposer frame, bonding the bumps of the semiconductor die to the interposer frame, and depositing an encapsulant over the semiconductor die and interposer frame.

In another embodiment, the present invention is a method of making a semiconductor device comprising the steps of providing a substrate having a die attach area, forming a uniform height insulating layer over the substrate around select points around a perimeter of the die attach area, mounting a semiconductor die over the uniform height insulating layer which provides a uniform standoff distance between the semiconductor die and substrate, bonding the semiconductor die to the substrate, and depositing an encapsulant between the semiconductor die and substrate.

In another embodiment, the present invention is a method of making a semiconductor device comprising the steps of providing a substrate having a die attach area, forming a first insulating layer over the substrate, mounting a semiconductor die over the first insulating layer which provides a standoff distance between the semiconductor die and substrate, and bonding the semiconductor die to the substrate.

In another embodiment, the present invention is a semiconductor device comprising a substrate having a die attach area. A uniform height insulating layer is formed over the substrate around select points around a perimeter of the die attach area.

A semiconductor die is mounted over the uniform height insulating layer which provides a uniform standoff distance between the semiconductor die and substrate. The semiconductor die is bonded to the substrate. An encapsulant is deposited between the semiconductor die and substrate.

BRIEF DESCRIPTION OF THE DRAWINGS

FIGS. 4a-4k illustrate a process of forming a uniform height insulating layer over an interposer frame as a standoff for a semiconductor die;

DETAILED DESCRIPTION OF THE DRAWINGS

Figure 1:
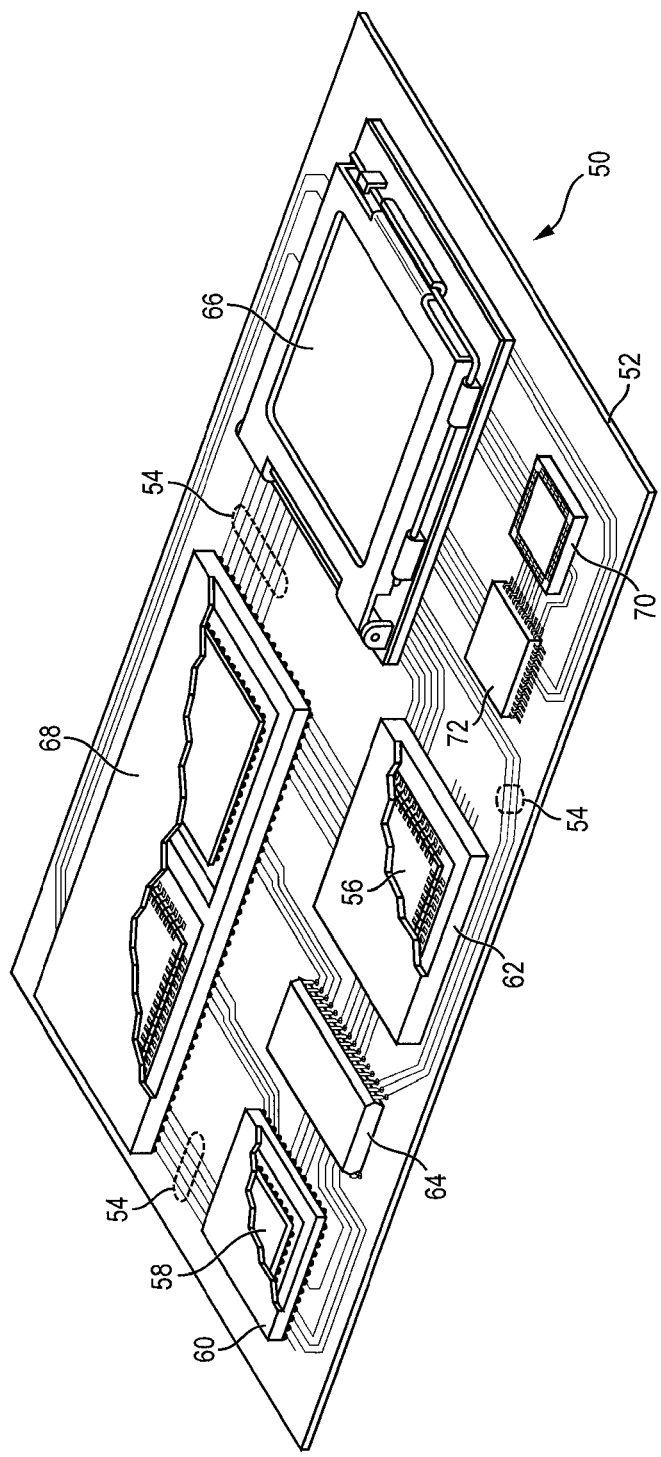
FIG. 1 illustrates a PCB with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 may have one type of semiconductor package, or multiple types of semiconductor packages, depending on the application. The different types of semiconductor packages are shown in FIG. 1 for purposes of illustration.

Electronic device 50 may be a stand-alone system that uses the semiconductor packages to perform one or more electrical functions. Alternatively, electronic device 50 may be a sub-component of a larger system. For example, electronic device 50 may be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. The miniaturization and the weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
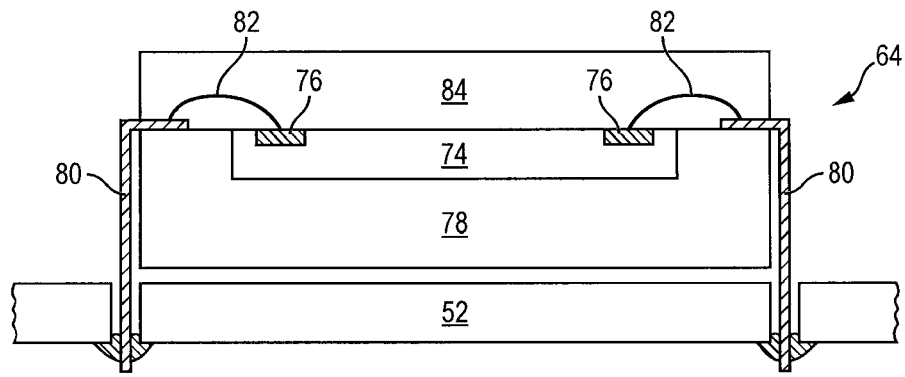
FIGS. 2a-2c illustrate further detail of the representative semiconductor packages mounted to the PCB.
Figure 2B:
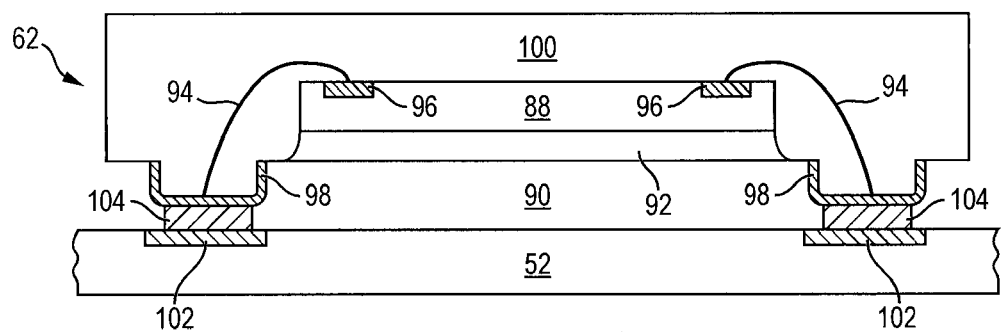
Figure 2C:
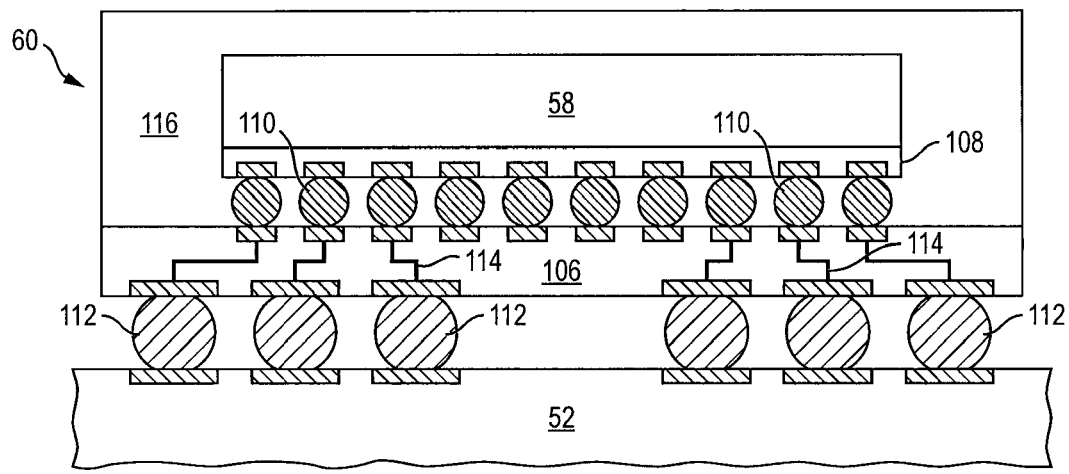

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating die 74 or bond wires 82.

FIG. 2b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 3A:
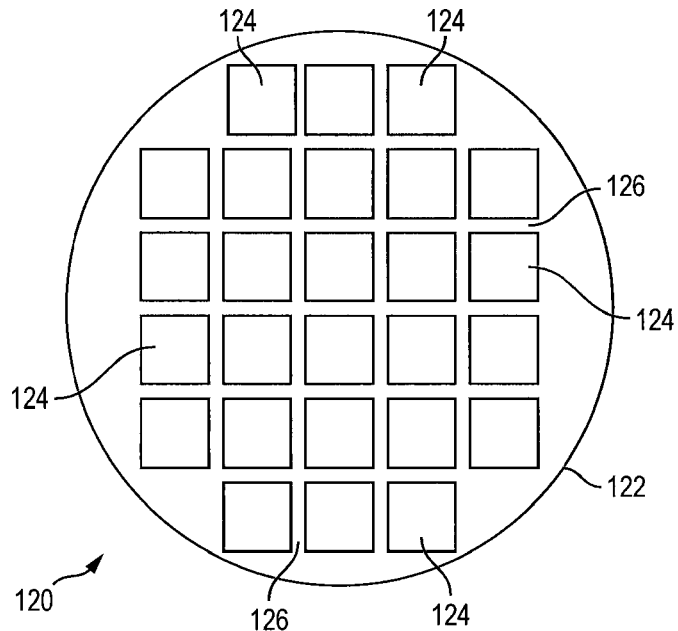
FIGS. 3a-3c illustrate a semiconductor wafer with a plurality of semiconductor die separated by a saw street.

FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by saw streets 126 as described above.

Figure 3B:
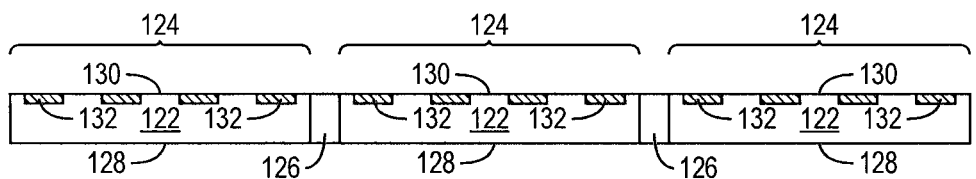

FIG. 3b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPD), such as inductors, capacitors, and resistors, for RF signal processing. In one embodiment, semiconductor die 124 is a flipchip type semiconductor die.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130.

An electrically conductive bump material is deposited over contact pads 132 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to contact pads 132 using a suitable attachment or bonding process. In one embodiment, the bump material is reflowed by heating the material above its melting point to form spherical balls or bumps 134. In some applications, bumps 134 are reflowed a second time to improve electrical contact to contact pads 132. The bumps can also be compression bonded to contact pads 132. Bumps 134 represent one type of interconnect structure that can be formed over contact pads 132. The interconnect structure can also use stud bump, micro bump, conductive pillars, or other electrical interconnect. Bumps 134 are electrically connected through contact pads 132 to circuits contained in active surface 130.

Figure 3C:
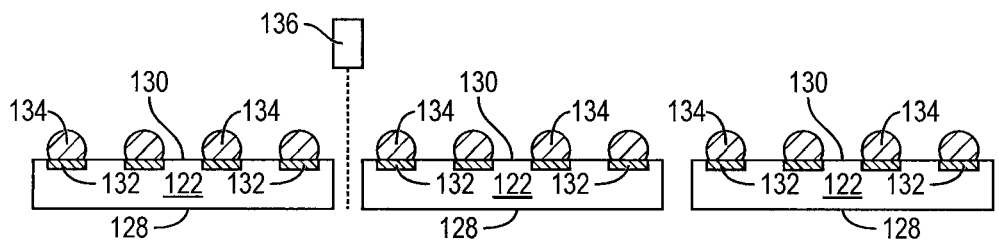

In FIG. 3c, semiconductor wafer 120 is singulated through saw street 126 using a saw blade or laser cutting tool 136 into individual semiconductor die 124.

Figure 4A:
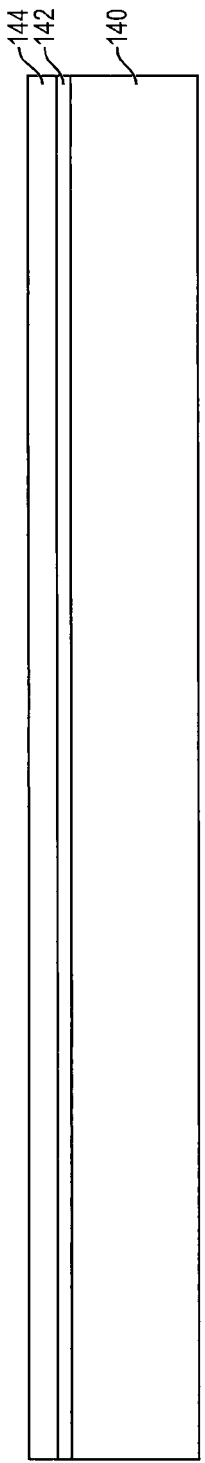

FIGS. 4a-4k illustrate, in relation to FIGS. 1 and 2a-2c, a process of forming a uniform height insulating layer over an interposer frame as a standoff for a semiconductor die. In FIG. 4a, a substrate or carrier 140 contains temporary or sacrificial base material such as silicon, polymer, beryllium oxide, or other suitable low-cost, rigid material for structural support. An interface layer or double-sided tape 142 is formed over carrier 140 as a temporary adhesive bonding film or etch-stop layer. A semiconductor wafer or substrate 144 contains a base material, such as silicon, germanium, gallium arsenide, indium phosphide, or silicon carbide, for structural support. As a semiconductor wafer, substrate 144 can contain embedded semiconductor die, semiconductor components, or passive devices. Substrate 144 can also be a multi-layer laminate, ceramic, or leadframe. Substrate 144 is mounted to interface layer 142 over carrier 140.

Figure 4B:
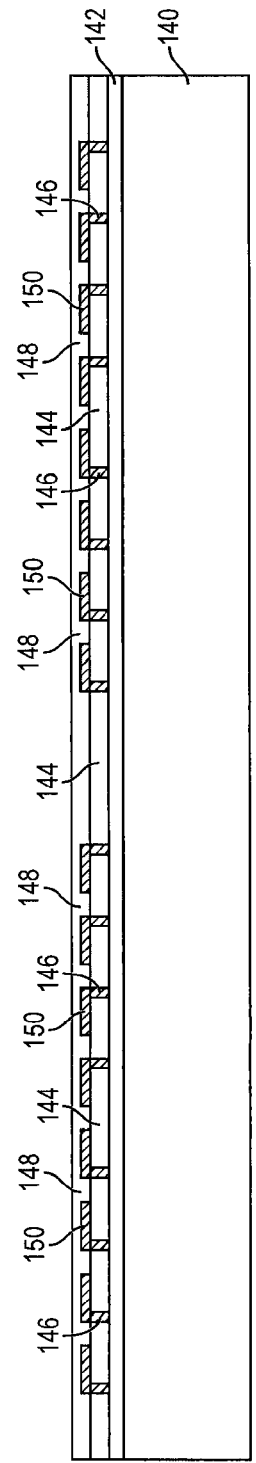

In FIG. 4b, a plurality of vias is formed through substrate 144 using laser drilling, mechanical drilling, or deep reactive ion etching (DRIE). The vias are filled with Al, Cu, Sn, Ni, Au, Ag, titanium (Ti), tungsten (W), poly-silicon, or other suitable electrically conductive material using electrolytic plating, electroless plating process, or other suitable metal deposition process to form z-direction vertical interconnect conductive vias 146.

An electrically conductive layer or RDL 150 is formed over a surface of substrate 144 and conductive vias 146 using a patterning and metal deposition process such as printing, PVD, CVD, sputtering, electrolytic plating, and electroless plating. Conductive layer 150 can be one or more layers of Al, Cu, Sn, Ni, Au, Ag, or other suitable electrically conductive material. Conductive layer 150 is electrically connected to conductive vias 146.

An insulating or passivation layer 148 is formed over a surface of substrate 144 and conductive layer 150 using PVD, CVD, printing, spin coating, spray coating, sintering or thermal oxidation. The insulating layer 148 contains one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties.

Figure 4C:
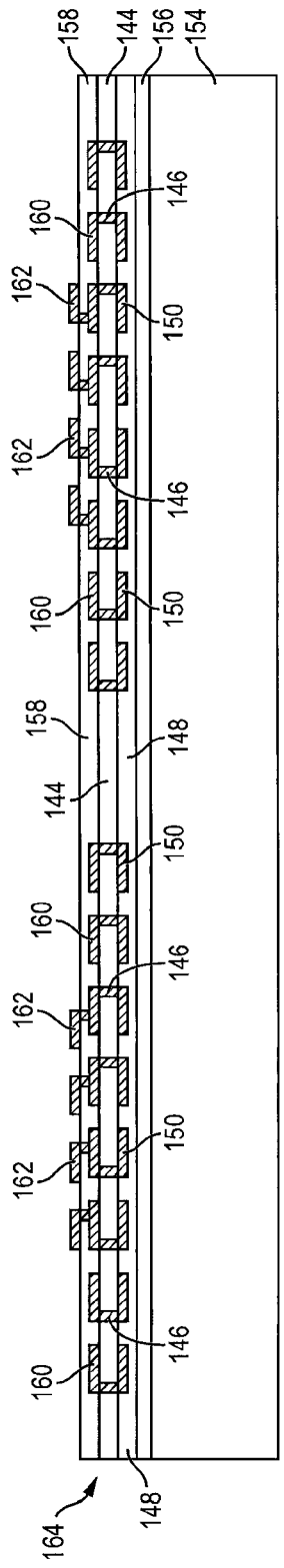

In FIG. 4c, a substrate or carrier 154 contains temporary or sacrificial base material such as silicon, polymer, beryllium oxide, or other suitable low-cost, rigid material for structural support. An interface layer or double-sided tape 156 is formed over carrier 154 as a temporary adhesive bonding film or etch-stop layer. Leading with insulating layer 148, substrate 144 is mounted to interface layer 156 over carrier 154. Carrier 140 and interface layer 142 are removed by chemical etching, mechanical peeling, CMP, mechanical grinding, thermal bake, UV light, laser scanning, or wet stripping to expose a surface of substrate 144 and conductive vias 146 opposite conductive layer 150.

An electrically conductive layer or RDL 160 is formed over a surface of substrate 144 and conductive vias 146 using a patterning and metal deposition process such as printing, PVD, CVD, sputtering, electrolytic plating, and electroless plating. Conductive layer 160 can be one or more layers of Al, Cu, Sn, Ni, Au, Ag, or other suitable electrically conductive material. Conductive layer 160 is electrically connected to conductive vias 146.

An insulating or passivation layer 158 is formed over substrate 144 and conductive layer 160 using PVD, CVD, printing, spin coating, spray coating, sintering or thermal oxidation.

The insulating layer 158 contains one or more layers of SiO2, Si3N4, SiON, Ta2O5, Al2O3, or other material having similar insulating and structural properties. A portion of insulating layer 158 is removed by an etching process to expose conductive layer 160.

An electrically conductive layer 162 is formed over insulating layer 158 and the exposed conductive layer 160 using a patterning and metal deposition process such as printing, PVD, CVD, sputtering, electrolytic plating, and electroless plating. Conductive layer 162 can be one or more layers of Al, Cu, Sn, Ni, Au, Ag, or other suitable electrically conductive material. Conductive layer 162 operates as contact pads electrically connected to conductive layer 160.

In another embodiment, conductive vias 146 are formed through substrate 144 after forming conductive layers 150 and 160. The combination of substrate 144, conductive vias 146, and conductive layers 150, 154, and 162 constitutes pre-formed interposer frame 164 with a vertical interconnect structure.

Figure 4D:
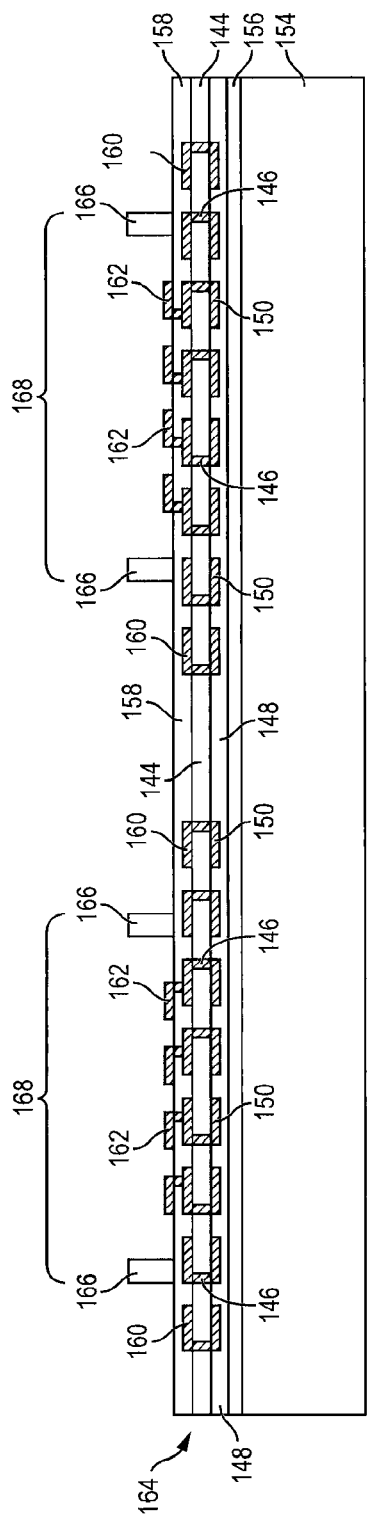
Figure 4E:
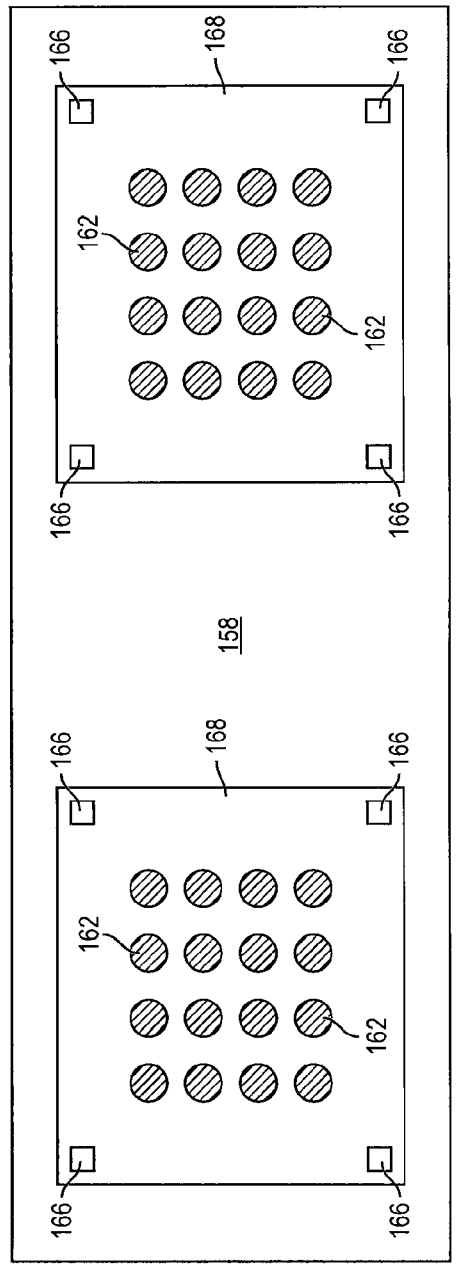
Figure 4F:
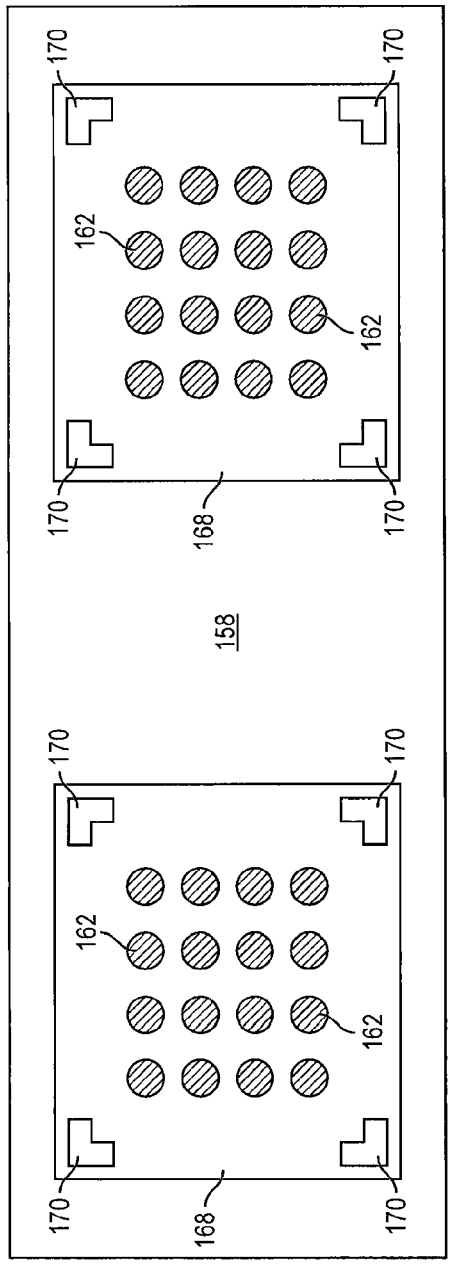
Figure 4G:
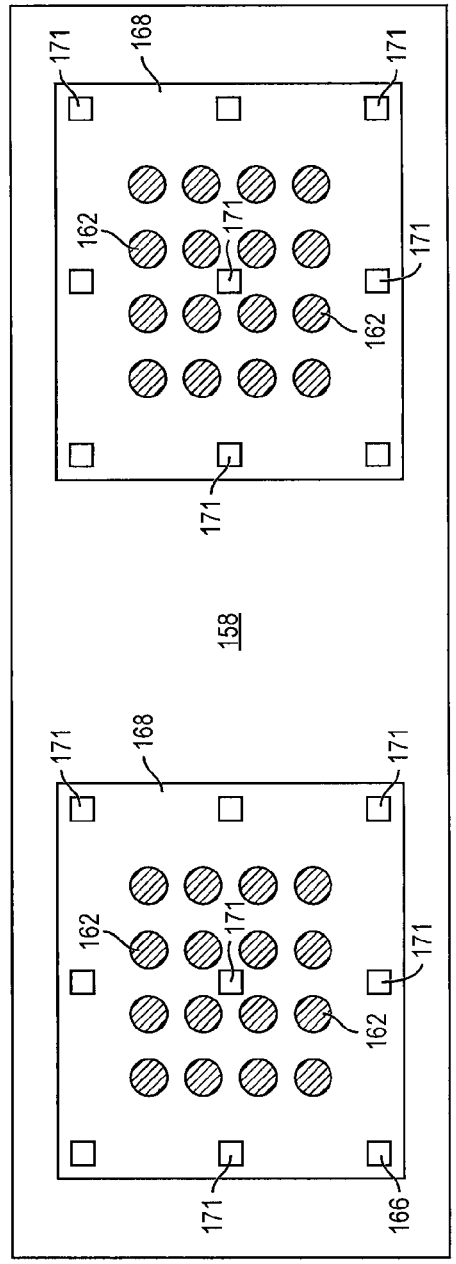

In FIG. 4d, a photoresist or insulating layer 166 is formed over insulating layer 158 using PVD, CVD, printing, spin coating, spray coating, sintering or thermal oxidation. The insulating layer 166 contains one or more layers of SiO2, Si3N4, SiON, Ta2O5, Al2O3, or other material having similar insulating and structural properties. In another embodiment, insulating layer 166 can be an epoxy material. In particular, insulating layer 166 is patterned as uniform height rectangular or circular pillars or columns disposed at the corners of die attach area 168 designated for placement of semiconductor die 124. In one embodiment, the height of insulating layer 166 is about 30-60 micrometers (μm). FIG. 4e shows a plan view of insulating layer 166 disposed at the four corners of die attach area 168. FIG. 4f shows another embodiment of insulating layer 170 as rectangular pillars or columns with 90-degree turn at the four corners of die attach area 168. FIG. 4g shows another embodiment of insulating layer 171 formed as uniform height pillars or columns at select points around a periphery of die attach area 168, as well as an interior region (central region) of the die attach area.

In FIG. 4h, semiconductor die 124 from FIGS. 3a-3c are positioned over and mounted to insulating layer 166 and interposer frame 164 using a pick and place operation. Active surface 130 contacts insulating layer 166 to provide support for semiconductor die 124 and maintain a fixed spacing between semiconductor die 124 and interposer frame 164. That is, insulating layer 166 maintains a uniform standoff distance between semiconductor die 124 and interposer frame 164. In one embodiment, the standoff distance is about 30-60 μm. The insulating layer 166 is able to provide a supporting standoff distance that is greater in height, as well as uniform in height, around die attach area 168 than would be achieved with conventional die attach techniques. The insulating layer 166 provides support of semiconductor die 124 to reduce die warpage. The insulating layer 164 also aids with alignment of bumps 134 to conductive layer 162 and reduces bump bridging and other electrical shorting between adjacent conductive layers. Bumps 134 are metallurgically and electrically connected to conductive layer 162 by reflow and pressure. A force can be applied to back surface 128 of semiconductor die 124 to assist with the bump bonding. The insulating layer 166 remains firm and non-compressive during bump bonding to maintain the standoff distance.

FIG. 4i shows semiconductor die 124 mounted to interposer frame 164 with insulating layer 166 maintaining a standoff distance between the semiconductor die and interposer frame. The insulating layer 166 provides support of semiconductor die 124 to reduce die warpage. Bumps 134 exhibit some degree of bump collapse during reflow. The uniform standoff distance reduces bump bonding failures attributed to bump collapse. An optional underfill material 172 is deposited between semiconductor die 124 and interposer frame 164.

Figure 4J:
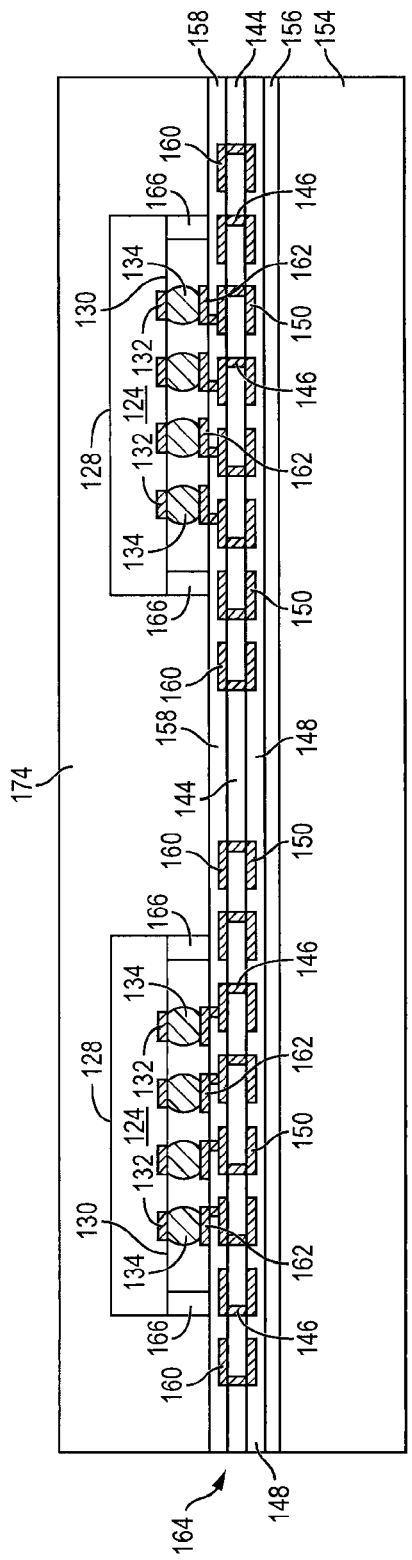

In FIG. 4j, an encapsulant or molding compound 174 is deposited over interposer frame 164 and around semiconductor die 124 using a paste printing, compressive molding, transfer molding, liquid encapsulant molding, vacuum lamination, spin coating, or other suitable applicator. Encapsulant 174 can be polymer composite material, such as epoxy resin with filler, epoxy acrylate with filler, or polymer with proper filler. Encapsulant 174 is non-conductive and environmentally protects the semiconductor device from external elements and contaminants. The uniform standoff distance between semiconductor die 124 and interposer frame 164 reduces underfill void formation during encapsulation.

Figure 4K:
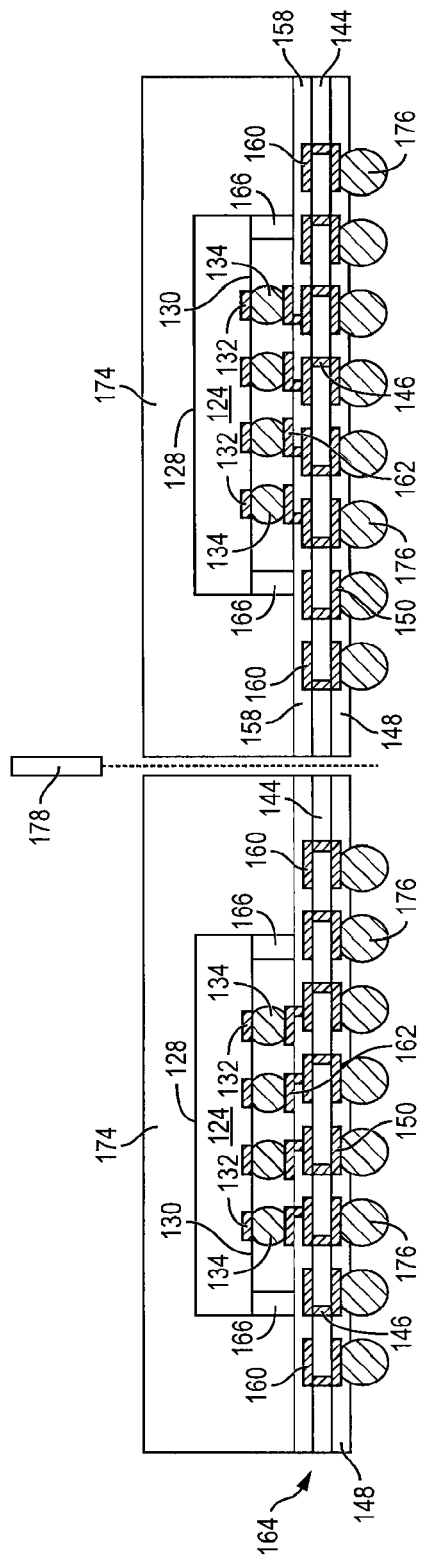

In FIG. 4k, carrier 154 and interface layer 156 are removed by chemical etching, mechanical peeling, chemical mechanical polish (CMP), mechanical grinding, thermal bake, UV light, laser scanning, or wet stripping to expose interposer frame 156. A portion of insulating layer 148 is removed by an etching process to expose conductive layer 150.

An electrically conductive bump material is deposited over the exposed portion of conductive layer 150 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 150 using a suitable attachment or bonding process. In one embodiment, the bump material is reflowed by heating the material above its melting point to form spherical balls or bumps 176. In some applications, bumps 176 are reflowed a second time to improve electrical contact to conductive layer 150. An under bump metallization (UBM) can be formed under bumps 176. The bumps can also be compression bonded to conductive layer 150. Bumps 176 represent one type of interconnect structure that can be formed over conductive layer 150. The interconnect structure can also use stud bump, micro bump, or other electrical interconnect.

Semiconductor die 124 are singulated through interposer frame 164 and encapsulant 174 with saw blade or laser cutting tool 178 into individual Fo-WLCSP 180.

Figure 5:
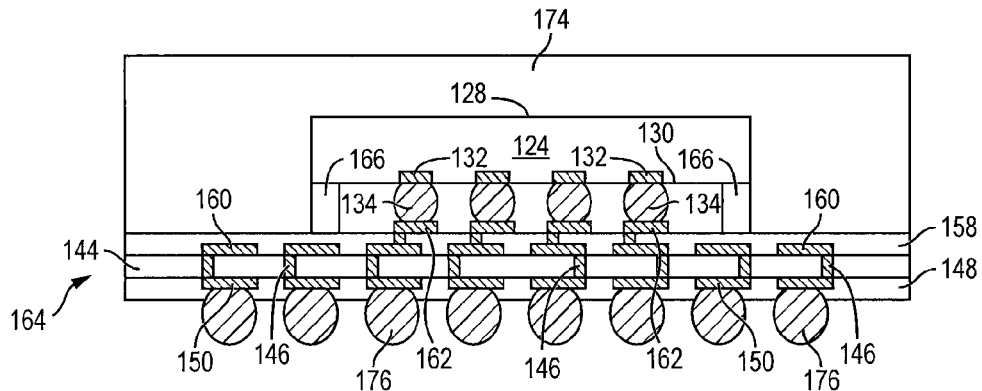
FIG. 5 illustrates the semiconductor die mounted over the insulating layer to the interposer frame.

FIG. 5 shows Fo-WLCSP 180 after singulation. Semiconductor die 124 is electrically connected through contact pads 132 and bumps 134 to interposer frame 164. The insulating layer 166 provides a fixed standoff distance between semiconductor die 124 and interposer frame 164. The insulating layer 166 remains firm and non-compressive during bump bonding and encapsulation to maintain a uniform standoff distance. The insulating layer 166 provides support of semiconductor die 124 to reduce die warpage. The insulating layer 166 is particularly effective to achieve a uniform standoff because of the ease of controlling the height of the insulating layer. The uniform standoff distance reduces void formation during encapsulation. The uniform standoff distance also reduces bump bonding failures attributed to bump collapse during reflow. The insulating layer 164 also aids with alignment of bumps 134 to conductive layer 162 and reduces bump bridging and other electrical shorting between adjacent conductive layers.

Figure 6A:
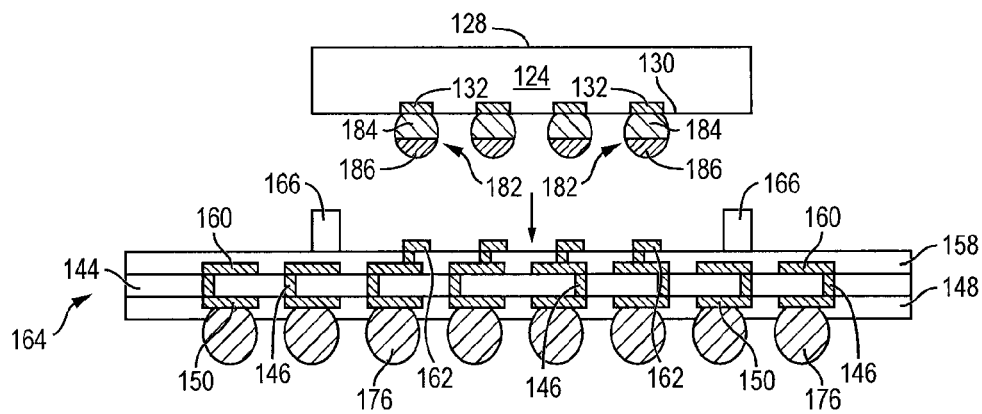
FIGS. 6a-6b illustrate a composite bump formed over the semiconductor die and mounted to the interposer frame.

FIG. 6a shows another embodiment of an interconnect structure formed over contact pads 132 of semiconductor die 124 as composite bumps 182 including a non-fusible or non-collapsible portion 184 and fusible or collapsible portion 186. The fusible or collapsible and non-fusible or non-collapsible attributes are defined for bumps 182 with respect to reflow conditions. The non-fusible portion 184 can be Au, Cu, Ni, high-lead solder, or lead-tin alloy. The fusible portion 186 can be Sn, lead-free alloy, Sn—Ag alloy, Sn—Ag—Cu alloy, Sn—Ag-indium (In) alloy, eutectic solder, tin alloys with Ag, Cu, or Pb, or other relatively low temperature melt solder. In one embodiment, given a contact pad 132 width or diameter of 80-100 μm, the non-fusible portion 184 is about 45 μm in height and fusible portion 186 is about 35 μm in height.

Figure 6B:
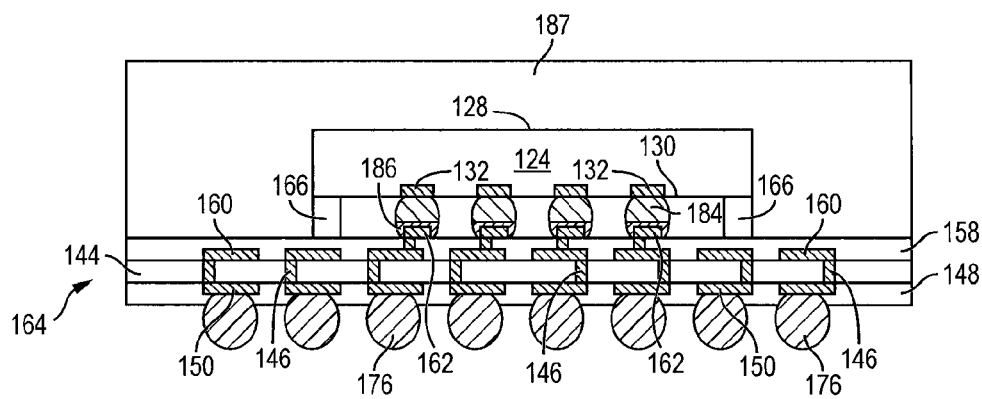

Semiconductor die 124 is positioned so that composite bump 182 is aligned with an interconnect site on conductive layer 162. Composite bump 182 is wider than the interconnect site on conductive layer 162. In one embodiment, composite bump 182 has a width of 80 μm and conductive layer 162 has a width of 35 μm. A pressure or force is applied to back surface 128 of semiconductor die 124 to press fusible portion 186 onto conductive layer 162, as shown in FIG. 6b. The force can be applied with an elevated temperature. Due to the compliant nature of fusible portion 186, the fusible portion deforms or extrudes around the top surface and side surfaces of conductive layer 162, referred to as bump-on-lead (BOL). In particular, the application of pressure causes fusible portion 186 to undergo a plastic deformation greater than about 25 μm under a force equivalent to a vertical load of about 250 grams and cover the top surface and side surfaces of conductive layer 162. Composite bump 182 can also be metallurgically connected to conductive layer 162 by bringing fusible portion 186 in physical contact with the conductive trace under reflow temperature. The non-fusible portion 140 does not melt or deform during the application of pressure or temperature and retains its height and shape as a vertical standoff between semiconductor die 124 and interposer frame 164. The additional displacement between semiconductor die 124 and interface frame 164 provides greater coplanarity tolerance between the mating surfaces.

By making composite bump 182 wider than conductive layer 162, the conductive trace pitch can be reduced to increase routing density and I/O count. The narrower conductive layer 162 reduces the force needed to deform fusible portion 186 around the conductive trace. For example, the requisite force may be 30-50% of the force needed to deform bump material against a conductive trace or pad that is wider than the bump material. The lower compressive force is useful for fine pitch interconnect and small die to maintain coplanarity with a specified tolerance and achieve uniform z-direction deformation and high reliability interconnect union. In addition, deforming fusible portion 186 around conductive layer 162 mechanically locks the bump to the interconnect site to prevent die shifting or die floating during reflow.

During a reflow process, a large number (e.g., thousands) of composite bumps 182 on semiconductor die 124 is attached to interconnect sites on conductive layer 162 of interposer frame 164. Some of the bumps may fail to properly connect to conductive layer 162, particularly if die 124 is warped. Recall that composite bump 182 is wider than conductive layer 162. With a proper force applied, the fusible portion 186 deforms or extrudes around the top surface and side surfaces of conductive layer 162 and mechanically locks composite bump 182 to the conductive trace. The mechanical interlock is formed by nature of the fusible portion 186 being softer and more compliant than conductive layer 162 and therefore deforming over the top surface and around the side surfaces of the conductive trace for greater contact surface area. The mechanical interlock between composite bump 182 and conductive layer 162 holds the bump to the conductive trace during reflow, i.e., the bump and conductive trace do not lose contact. Accordingly, composite bump 182 mating to conductive layer 156 reduces bump interconnect failures.

An encapsulant or molding compound 187 is deposited over interposer frame 164 and around semiconductor die 124 using a paste printing, compressive molding, transfer molding, liquid encapsulant molding, vacuum lamination, spin coating, or other suitable applicator. Encapsulant 187 can be polymer composite material, such as epoxy resin with filler, epoxy acrylate with filler, or polymer with proper filler. Encapsulant 187 is non-conductive and environmentally protects the semiconductor device from external elements and contaminants. The uniform standoff distance between semiconductor die 124 and interposer frame 164 reduces underfill void formation during encapsulation.

Figure 7A:
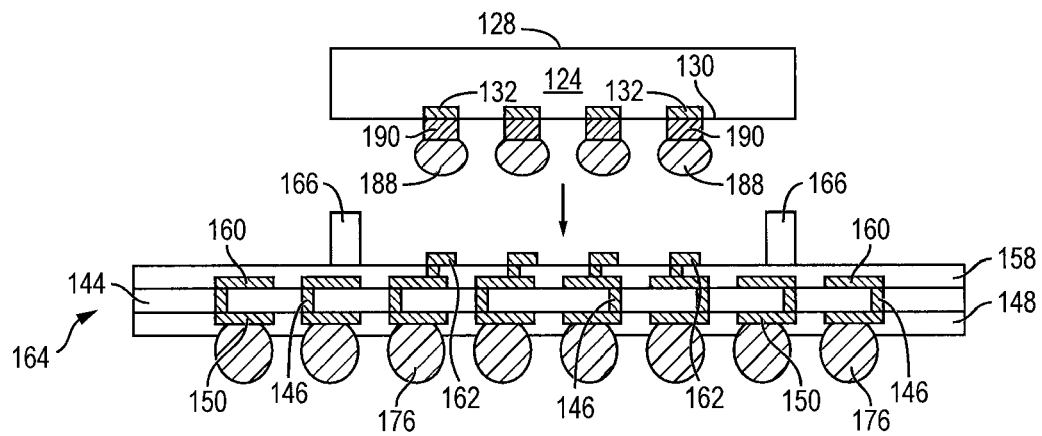
FIGS. 7a-7b illustrate a conductive pillar and bump formed over the semiconductor die and mounted to the interposer frame.

FIG. 7a shows another embodiment of an interconnect structure formed over contact pads 132 of semiconductor die 124 as bump 188 over conductive pillar 190. Bump 188 is fusible or collapsible and conductive pillar 190 is non-fusible or non-collapsible. The fusible or collapsible and non-fusible or non-collapsible attributes are defined with respect to reflow conditions. Bump 188 can be Sn, lead-free alloy, Sn—Ag alloy, Sn—Ag—Cu alloy, Sn—Ag—In alloy, eutectic solder, tin alloys with Ag, Cu, or Pb, or other relatively low temperature melt solder. Conductive pillar 190 can be Au, Cu, Ni, high-lead solder, or lead-tin alloy. In one embodiment, conductive pillar 190 is a Cu pillar and bump 188 is a solder cap. Given a contact pad 132 width or diameter of 80-100 μm, conductive pillar 190 is about 45 μm μm in height and bump 188 is about 35 μm in height.

Figure 7B:
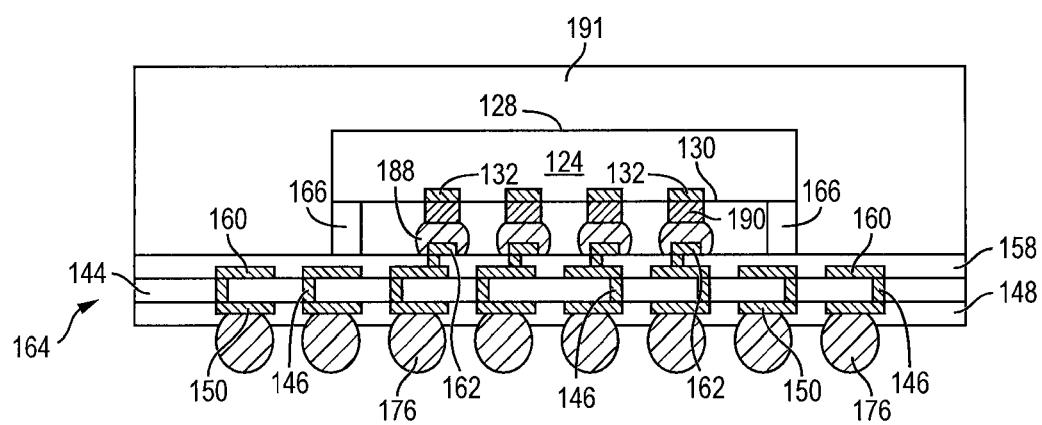

Semiconductor die 124 is positioned so that bump 188 is aligned with an interconnect site on conductive layer 162. Bump 188 is wider than conductive layer 162. A pressure or force is applied to back surface 128 of semiconductor die 124 to press bump 188 onto conductive layer 162. The force can be applied with an elevated temperature. Due to the compliant nature of bump 188, the bump deforms or extrudes around the top surface and side surfaces of conductive layer 162, as shown in FIG. 7b. In particular, the application of pressure causes bump 188 to undergo a plastic deformation and cover the top surface and side surfaces of conductive layer 162. Conductive pillar 190 and bump 188 can also be metallurgically connected to conductive layer 162 by bringing the bump in physical contact with the conductive trace under reflow temperature. Conductive pillar 190 does not melt or deform during the application of pressure or temperature and retains its height and shape as a vertical standoff between semiconductor die 124 and interposer frame 164. The additional displacement between semiconductor die 124 and interposer frame 164 provides greater coplanarity tolerance between the mating surfaces. The wider bump 188 and narrower conductive layer 162 have similar low requisite compressive force and mechanical locking features and advantages described above for composite bump 182.

An encapsulant or molding compound 191 is deposited over interposer frame 164 and around semiconductor die 124 using a paste printing, compressive molding, transfer molding, liquid encapsulant molding, vacuum lamination, spin coating, or other suitable applicator. Encapsulant 191 can be polymer composite material, such as epoxy resin with filler, epoxy acrylate with filler, or polymer with proper filler. Encapsulant 191 is non-conductive and environmentally protects the semiconductor device from external elements and contaminants. The uniform standoff distance between semiconductor die 124 and interposer frame 164 reduces underfill void formation during encapsulation.

Figure 8A:
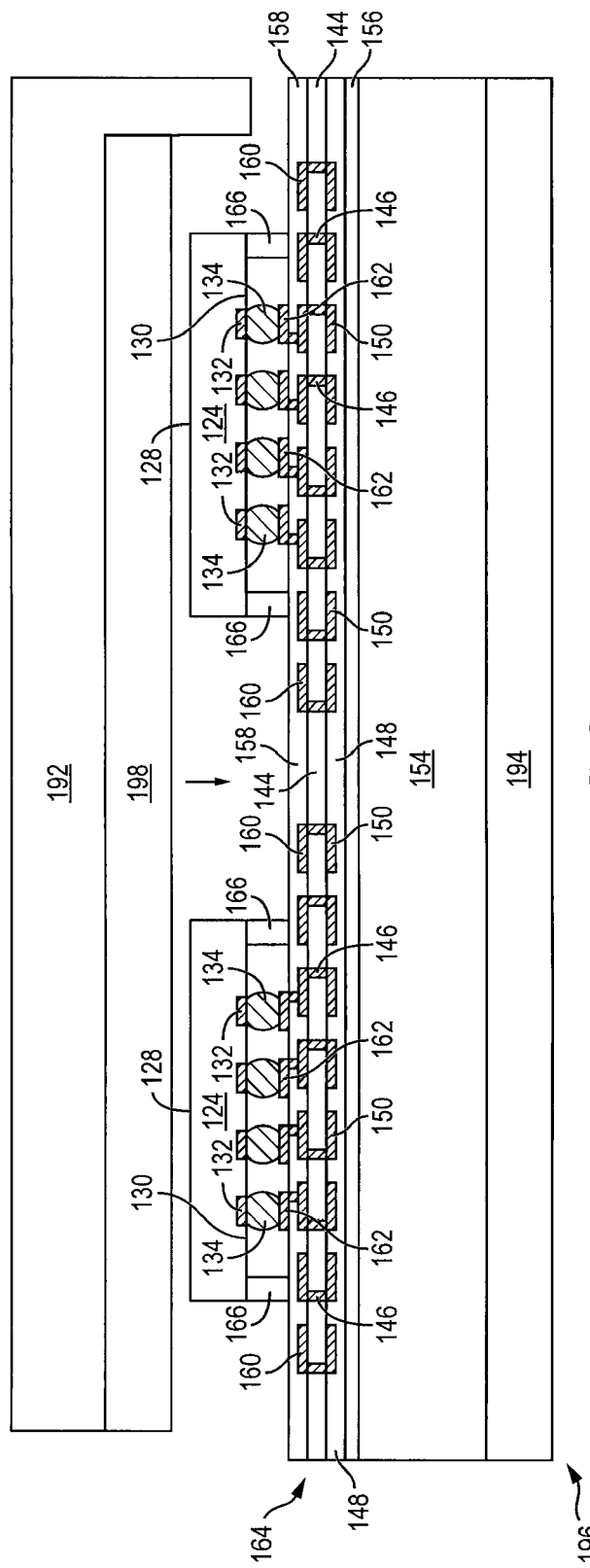
FIGS. 8a-8c illustrate a mold underfill process for the semiconductor die and interposer frame.
Figure 8B:
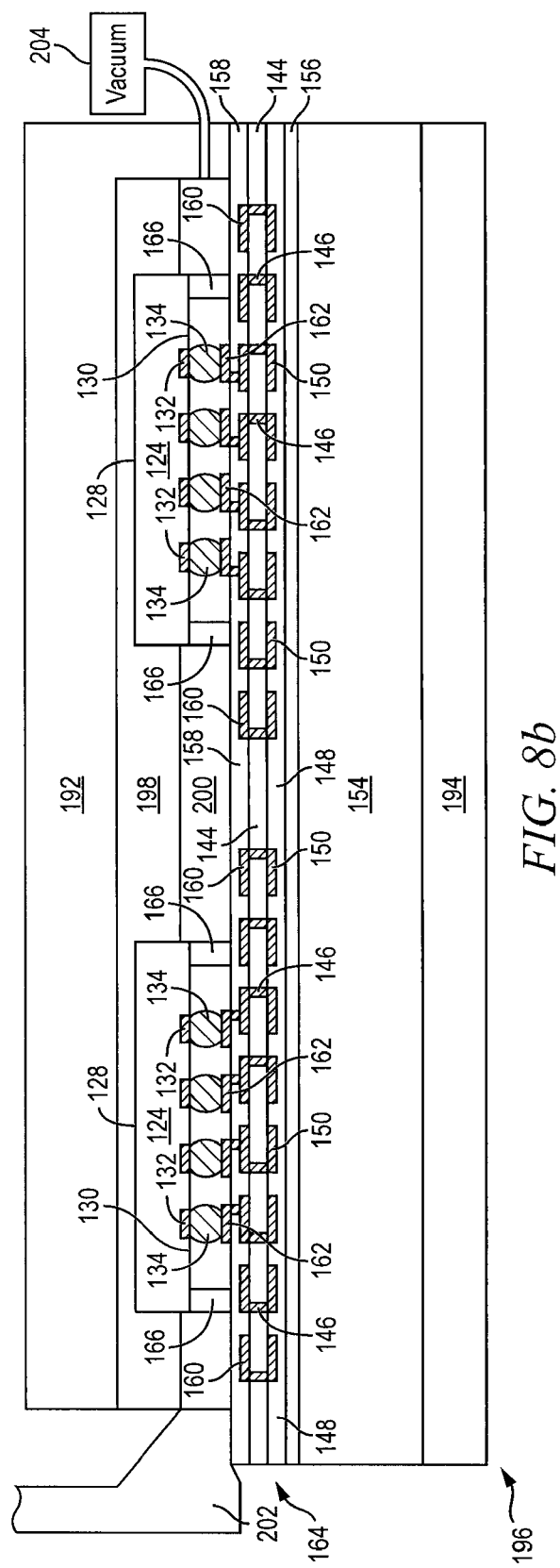
Figure 8C:
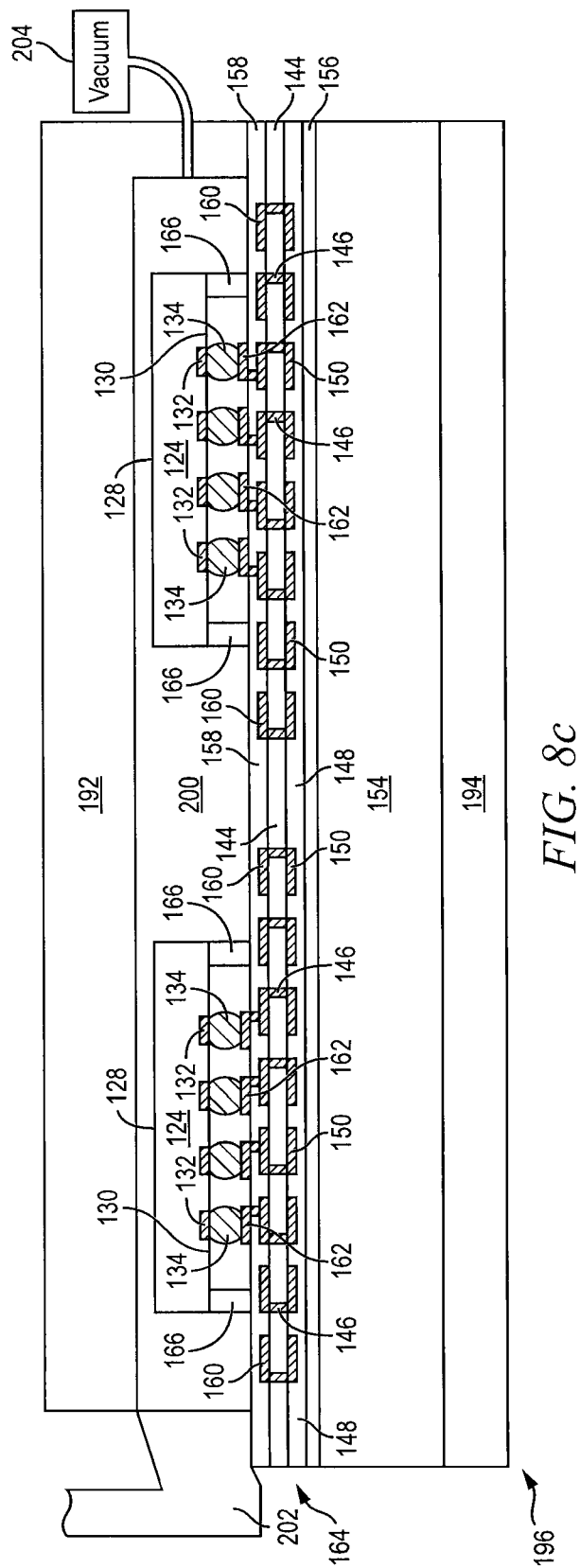

FIGS. 8a-8c show a mold underfill (MUF) process to deposit encapsulant around the bumps between the semiconductor die and interposer frame. FIG. 8a shows semiconductor die 124 mounted to interposer frame 164 using bump 134 and placed between upper mold support 192 and lower mold support 194 of chase mold 196. The upper mold support 192 includes compressible releasing film 198.

In FIG. 8b, upper mold support 192 and lower mold support 194 are brought together to enclose semiconductor die 124 and interposer frame 164 with an open space over the interposer and between the semiconductor die and interposer. Compressible releasing film 198 conforms to back surface 128 and side surfaces of semiconductor die 124 to block formation of encapsulant on these surfaces. An encapsulant 200 in a liquid state is injected into one side of chase mold 196 with nozzle 202 while an optional vacuum assist 204 draws pressure from the opposite side to uniformly fill the open space over interposer frame 164 and the open space between semiconductor die 124 and interposer frame 164 with the encapsulant. Compressible material 198 prevents encapsulant 200 from flowing over back surface 128 and around the side surfaces of semiconductor die 124. Encapsulant 200 is cured. The back surface 128 and side surfaces of semiconductor die 124 remain exposed from encapsulant 200.

FIG. 8c shows an embodiment of MUF and mold overfill (MOF) without compressible material 198. Semiconductor die 124 and interposer frame 164 are placed between upper mold support 192 and lower mold support 194 of chase mold 196. The upper mold support 192 and lower mold support 194 are brought together to enclose semiconductor die 124 and interposer frame 164 with an open space over the interposer, around the semiconductor die, and between the semiconductor die and interposer. Encapsulant 200 in a liquid state is injected into one side of chase mold 196 with nozzle 202 while an optional vacuum assist 204 draws pressure from the opposite side to uniformly fill the open space around semiconductor die 124 and over substrate 154 and the open space between semiconductor die 124 and interposer frame 164 with the encapsulant. Encapsulant 200 is cured.

Figure 9:
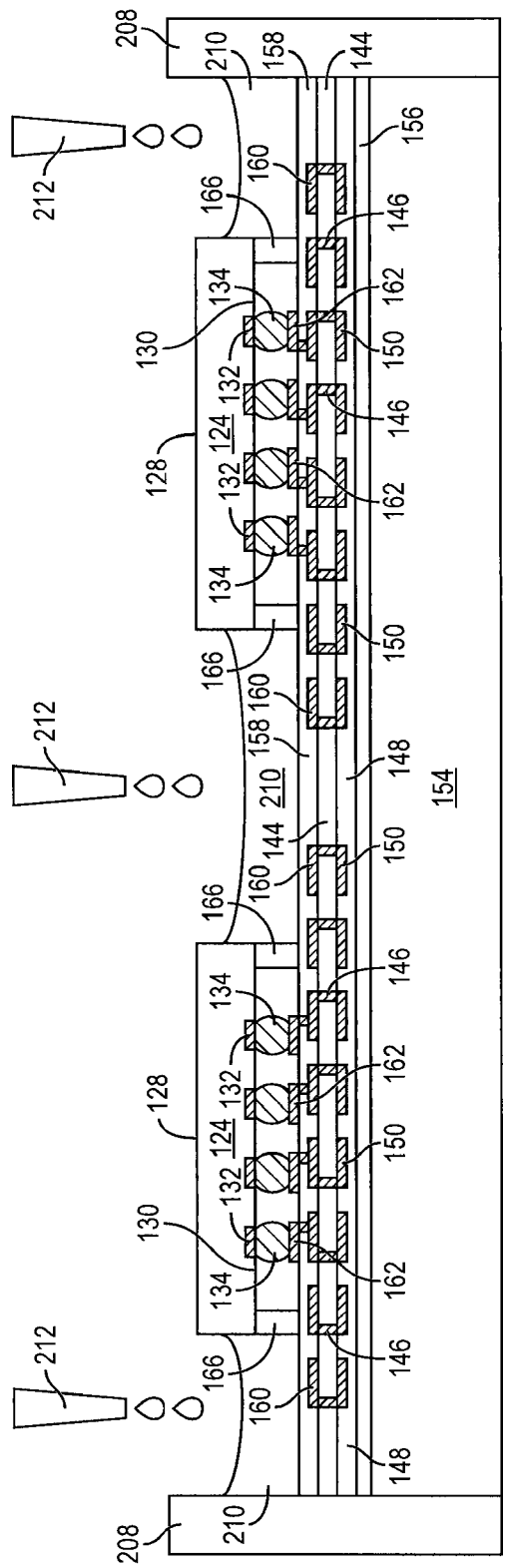
FIG. 9 illustrates another process of depositing encapsulant over the semiconductor die and interposer frame.

FIG. 9 shows another embodiment of depositing encapsulant around semiconductor die 124 and in the gap between semiconductor die 124 and interposer frame 164. Semiconductor die 124 and interposer frame 164 are enclosed by dam 208. Encapsulant 210 is dispensed from nozzles 212 in a liquid state into dam 208 to fill the open space over interposer frame 164 and the open space between semiconductor die 124 and interposer frame 164. The volume of encapsulant 210 dispensed from nozzles 212 is controlled to fill dam 208 without covering back surface 128 or the side surfaces of semiconductor die 124. Encapsulant 210 is cured.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing an interposer frame including,
   (a) providing a substrate,
   (b) forming a conductive via in the substrate, and
   (c) forming a first conductive layer over the conductive via;
   forming a first insulating layer over the first conductive layer;
   forming a second conductive layer over the substrate opposite the first conductive layer, the second conductive layer being electrically connected to the conductive via;
   forming a second insulating layer over the second conductive layer;
   forming a third conductive layer over the second insulating layer electrically connected to the second conductive layer;
   providing a die attach area on the substrate;
   forming a plurality of discrete uniform height pillars over the interposer frame at corners of the die attach area with physical space extending to the interposer frame between the discrete uniform height pillars;
   providing a semiconductor die including a plurality of bumps;
   disposing the semiconductor die over the discrete uniform height pillars which provides a fixed uniform standoff distance between the semiconductor die and the interposer frame;
   bonding the bumps of the semiconductor die to the first conductive layer of the interposer frame while the discrete uniform height pillars maintain the fixed uniform standoff distance; and
   depositing an encapsulant between the semiconductor die and interposer frame by injecting the encapsulant through the physical space between the discrete uniform height pillars.

2. The method of claim 1, further including forming the discrete uniform height pillars as rectangular or circular pillars at the corners of the die attach area.

3. The method of claim 1, further including forming a portion of the discrete uniform height pillars in a central region of the die attach area.

4. A method of making a semiconductor device, comprising:
   providing a substrate;
   forming a plurality of conductive vias through the substrate;
   forming a first conductive layer over a first surface of the substrate, the first conductive layer being electrically connected to the conductive vias;
   forming a first insulating layer over the first conductive layer;
   forming a second conductive layer over a second surface of the substrate opposite the first surface of the substrate, the second conductive layer being electrically connected to the conductive vias;
   forming a second insulating layer over the second conductive layer;
   forming a third conductive layer over the second insulating layer electrically connected to the second conductive layer;
   providing a die attach area on the substrate;
   forming a plurality of discrete uniform height pillars over the substrate at select points around a perimeter of the die attach area;
   disposing a semiconductor die over the discrete uniform height pillars which provides a fixed region of physical space between the semiconductor die and the substrate;
   bonding the semiconductor die to the substrate; and
   depositing an encapsulant in the fixed region of physical space between the semiconductor die and the substrate by injecting the encapsulant between the discrete uniform height pillars sufficient to fill the fixed region of physical space between the semiconductor die and substrate.

5. The method of claim 4, further including forming the discrete uniform height pillars as rectangular or circular pillars at corners of the die attach area.

6. The method of claim 4, further including forming the discrete uniform height pillars with a 90 degree turn at corners of the die attach area.

7. The method of claim 4, further including forming a portion of the discrete uniform height pillars in a central region of the die attach area.

8. The method of claim 4, further including forming a composite bump over the semiconductor die, the composite bump including a non-fusible portion over a contact pad of the semiconductor die and a fusible portion over the non-fusible portion.

9. The method of claim 4, further including:
   forming a conductive pillar over a contact pad of the semiconductor die; and
   forming a fusible bump over the conductive pillar.

10. The method of claim 4, further including drawing a vacuum between the discrete uniform height pillars to deposit the encapsulant in the fixed spacing between the semiconductor die and the substrate.

11. A method of making a semiconductor device, comprising:
    providing a substrate having a die attach area;
    forming a first insulating layer over the substrate;
    mounting a semiconductor die over the first insulating layer which provides a standoff distance between the semiconductor die and the substrate;
    bonding the semiconductor die to the substrate;
    forming a plurality of conductive vias through the substrate;
    forming a first conductive layer over a first surface of the substrate, the first conductive layer being electrically connected to the conductive vias;
    forming a second insulating layer over the first conductive layer;
    forming a second conductive layer over a second surface of the substrate opposite the first surface of the substrate, the second conductive layer being electrically connected to the conductive vias;
    forming a third insulating layer over the second conductive layer; and forming a third conductive layer over the third insulating layer electrically connected to the second conductive layer.

12. A method of making a semiconductor device, comprising:
    providing a substrate;
    forming a plurality of conductive vias through the substrate;
    forming a first conductive layer over a first surface of the substrate, the first conductive layer being electrically connected to the conductive vias;
    forming a first insulating layer over the first conductive layer;
    forming a second conductive layer over a second surface of the substrate opposite the first surface of the substrate, the second conductive layer being electrically connected to the conductive vias;
    forming a second insulating layer over the second conductive layer;
    forming a third conductive layer over the second insulating layer electrically connected to the second conductive layer;
    forming a third insulating layer including a standoff height over the substrate;
    providing a semiconductor die;
    disposing the semiconductor die over the third insulating layer; and
    depositing an underfill material between the semiconductor die and the substrate by injecting the underfill material through a first opening in the third insulating layer.

13. The method of claim 12, further including depositing an encapsulant over the semiconductor die and the substrate.

14. The method of claim 12, further including:
    forming a die attach area over the substrate; and
    forming the third insulating layer in a central region of the die attach area.

15. The method of claim 12, further including forming a composite bump over the semiconductor die, the composite bump including a non-fusible portion over a contact pad of the semiconductor die and a fusible portion over the non-fusible portion.

16. The method of claim 12, further including:
    forming a conductive pillar over a contact pad of the semiconductor die; and
    forming a bump over the conductive pillar.

17. The method of claim 12, further including drawing a vacuum from a second opening in the third insulating layer to deposit the underfill material between the semiconductor die and substrate.

* * * * *